US012777900B2

(12) United States Patent
Tseng et al.

(10) Patent No.: US 12,777,900 B2
(45) Date of Patent: Oct. 27, 2026

(54) METHOD COMPRISING AN ANTI-REFLECTION TRI-LAYER STACK FOR MANUFACTURING A SEMICONDUCTOR STRUCTURE

(71) Applicant: NANYA TECHNOLOGY CORPORATION, New Taipei city (TW)

(72) Inventors: Tzu-Li Tseng, New Taipei City (TW); Zhi-Xuan Shen, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 355 days.

(21) Appl. No.: 18/438,504

(22) Filed: Feb. 11, 2024

(65) Prior Publication Data

US 2025/0259845 A1 Aug. 14, 2025

(51) Int. Cl.

| | |
|---|---|
| ***H10P 76/40*** | (2026.01) |
| ***G03F 7/09*** | (2006.01) |
| ***H10P 50/00*** | (2026.01) |
| ***H10P 50/28*** | (2026.01) |

(52) U.S. Cl.

CPC .......... *H10P 76/4085* (2026.01); *G03F 7/091* (2013.01); *H10P 50/283* (2026.01); *H10P 50/73* (2026.01)

(58) Field of Classification Search

CPC .................................................. H10P 76/2043

See application file for complete search history.

(56) References Cited

U.S. PATENT DOCUMENTS

2020/0312662 A1* 10/2020 Chang ................. H10P 76/2043
2022/0320126 A1* 10/2022 Wang ...................... H10B 41/42
2023/0019605 A1* 1/2023 Wu ........................ H10D 1/043
2023/0078443 A1* 3/2023 Wu ........................ H10B 12/03
438/669

* cited by examiner

*Primary Examiner* — Nduka E Ojeh
(74) *Attorney, Agent, or Firm* — CKC & Partners Co., LLC

(57) ABSTRACT

Embodiments of this disclosure provide a method of manufacturing a semiconductor, including the following steps. A substrate comprising an active layer on the substrate is provided, and the substrate is defined with an array area and a peripheral area surrounding the array area. A first film layer is formed on the active layer. A second film layer is formed on the first film layer. An anti-reflection tri-layer stack containing a capacitor pattern is formed on the second film layer, and the anti-reflection tri-layer stack includes a nitrogen-free anti-reflection layer. A photoresist mask is formed on the anti-reflection tri-layer stack to expose the anti-reflection tri-layer stack in the array area. A lithography process id performed on the photoresist mask and the anti-reflection tri-layer stack in the array area. Trenches are formed in the second film layer and the first film layer in the array area based on the capacitor pattern.

20 Claims, 8 Drawing Sheets

METHOD COMPRISING AN ANTI-REFLECTION TRI-LAYER STACK FOR MANUFACTURING A SEMICONDUCTOR STRUCTURE

BACKGROUND

Field of Invention

The present disclosure relates to a method of manufacturing a semiconductor structure. More particularly, the present disclosure relates to a method of manufacturing a semiconductor structure through an anti-reflection tri-layer stack.

Description of Related Art

As electronic devices become lighter and thinner, semiconductor devices, such as dynamic random access memory (DRAM) become more highly integrated. Further, the performance of the DRAM is improved via shortening the pitch between the semiconductor structures in the DRAM. In addition to increasing the difficulty of the manufacturing process, the components in the semiconductor structures are also prone to leakage resulting from too close distances because of shrinking the size of the semiconductor structure.

As a result, in the semiconductor manufacturing process, how to reduce the leakage to improve the process yield of the semiconductor structure has become an important issue.

SUMMARY

Embodiments of this disclosure provide a method of manufacturing a semiconductor, including the following steps. A substrate including an active layer on the substrate is provided, and the substrate is defined with an array area and a peripheral area surrounding the array area. A first film layer is formed on the active layer. A second film layer is formed on the first film layer. An anti-reflection tri-layer stack containing a capacitor pattern is formed on the second film layer, and the anti-reflection tri-layer stack includes a nitrogen-free anti-reflection layer. A photoresist mask is formed on the anti-reflection tri-layer stack to expose the anti-reflection tri-layer stack in the array area. A lithography process id performed on the photoresist mask and the anti-reflection tri-layer stack in the array area. A plurality of trenches are formed in the second film layer and the first film layer in the array area based on the capacitor pattern.

In some embodiments, forming the anti-reflection tri-layer includes adding $SiH_4$, performing the lithography process on the photoresist mask includes adding $CO_2$, and a retained $SiH_4$ and $CO_2$ react to each other and SiCO is generated.

In some embodiments, forming the anti-reflection tri-layer stack includes the following steps. A first anti-reflection layer containing the capacitor pattern is formed on the second film layer. A second anti-reflection layer and a third anti-reflection layer are formed on the first anti-reflection layer in sequence, and the third anti-reflection layer is the nitrogen-free anti-reflection layer. A photoresist mask is on the third anti-reflection layer in a peripheral area of the semiconductor structure.

In some embodiments, the first anti-reflection layer is formed by a self-aligned double patterning.

In some embodiments, the self-aligned double patterning includes the following steps. A hard mask layer is formed on the second film layer. A mandrel mask containing a contact hole layout is formed on a plurality of first top surfaces of the hard mask layer to form a plurality of protrusions. A dielectric layer is conformally deposited on the mandrel mask, and a plurality of second top surfaces and a plurality of third top surfaces of the hard mask layer. The dielectric layer on the mandrel mask and the plurality of third top surfaces of the hard mask layer is removed to form a plurality of spacers on both sides of each of the plurality of the protrusions of the mandrel mask, and the plurality of the third top surfaces of the hard mask layer are exposed. The mandrel mask is removed to expose the plurality of the first top surfaces of the hard mask layer. The lithography process is performed on the plurality of spacers, and the plurality of first top surfaces and the plurality of third top surfaces of the hard mask layer. The hard mask layer at position of the plurality of first top surfaces and the plurality of third top surfaces of the hard mask layer is etched to form a plurality of openings in the hard mask layer.

In some embodiments, a top surface of each of the plurality of spacers and the mandrel mask are coplanar after removing the dielectric layer to form the plurality of spacers.

In some embodiments, the photoresist mask contains a zic-zac chop layout.

In some embodiments, the plurality of trenches are formed by a dry etching process.

In some embodiments, the dry etching process is performed through $Cl_2$, COS or $SO_2$ combined with $O_2$.

In some embodiments, the capacitor pattern is a diagonal pattern or a non-orthogonal pattern.

Embodiments of this disclosure provide a method of manufacturing a semiconductor, including the following steps. A substrate including an active layer on the substrate is provided, and the substrate is defined with an array area and a peripheral area surrounding the array area. A first film layer is formed on the active layer. A first anti-reflection layer containing a capacitor pattern is formed on the second film layer. A second anti-reflection layer and a third anti-reflection layer are formed on the first anti-reflection layer in sequence. A photoresist mask is formed on the third anti-reflection layer in the peripheral area to expose a top surface of the third anti-reflection layer in the array area. A lithography process is performed on the photoresist mask and the third anti-reflection layer in the array area. A plurality of trenches are formed in the second film layer and the first film layer in the array area based on the capacitor pattern.

In some embodiments, the photoresist mask is a zic-zac chop mask.

In some embodiments, the first anti-reflection layer containing the capacitor pattern is formed by a self-aligned double patterning.

In some embodiments, the self-aligned double patterning includes the following steps. A hard mask layer is formed on the second film layer. A mandrel mask containing a contact layout is formed on a plurality of first top surfaces of the hard mask layer to form a plurality of protrusions. A dielectric layer is conformally deposited on the mandrel mask, and a plurality of second top surfaces and a plurality of third top surfaces of the hard mask layer. The dielectric layer on the mandrel mask and the plurality of third top surfaces of the hard mask layer is removed to form a plurality of spacers on both sides of each of the plurality of protrusions of the mandrel mask, and the plurality of third top surfaces of the hard mask layer are exposed. The mandrel mask is removed to expose the plurality of first top surfaces of the mandrel mask. The lithography process is performed on the plurality of spacers, and the plurality of first top surfaces and the plurality of third top surfaces of the hard mask layer. The hard mask layer at position of the plurality of first top surfaces and the plurality of third top surfaces of the hard mask layer is etched to form a plurality of openings in the hard mask layer.

In some embodiments, the third anti-reflection layer is nitrogen free.

In some embodiments, forming the anti-reflection tri-layer includes adding $SiH_4$, performing the lithography process on the photoresist mask includes adding $CO_2$, and a retained $SiH_4$ and $CO_2$ react to each other and SiCO is generated.

In some embodiments, the plurality of trenches is formed by a dry etching process.

In some embodiments, the dry etching process includes the following steps. The photoresist mask in the peripheral area is etched on the third anti-reflection layer. The third anti-reflection layer and the second anti-reflection layer in the array area are etched to expose a top surface of the first anti-reflection layer in the array area. The second film layer and the first film layer in the array area are etched based on the capacitor pattern to form the plurality of trenches.

In some embodiments, the dry etching process is performed through $Cl_2$, COS or $SO_2$combined with $O_2$.

In some embodiments, after forming the plurality of the trenches, there is a height difference between a top surface of the first anti-reflection layer and a topmost surface of the first anti-reflection layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The disclosure can be more fully understood by reading the following detailed description of the embodiment, with reference made to the accompanying drawings as follows.

DETAILED DESCRIPTION

Figure 1:
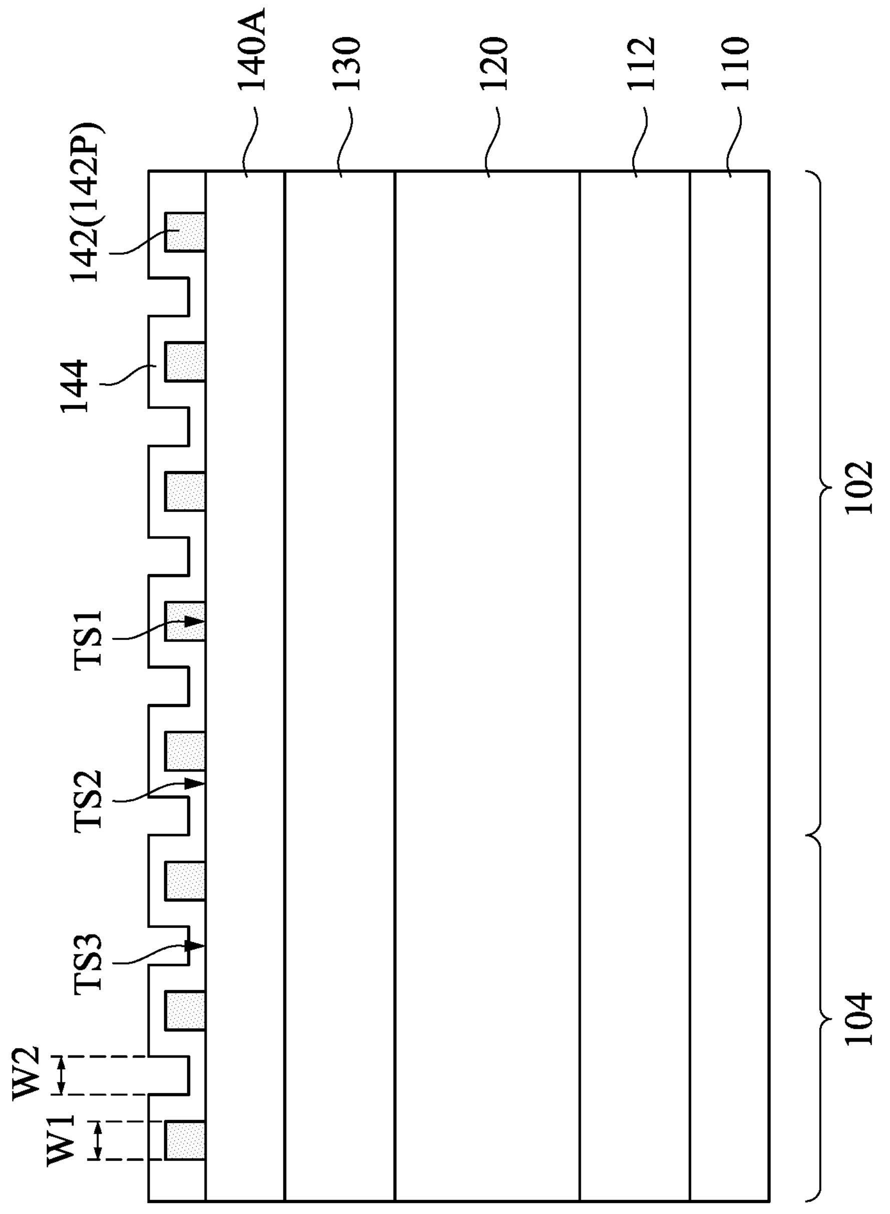
FIGS. 1-4 are views of a method of manufacturing a semiconductor structure at stages of forming a first anti-reflection layer according to some embodiments of this disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

Currently, a photoresist mask, a zic-zac chop mask, for patterning a capacitor structure is used in a lithography process, and a footing formed by scumming is observed at an edge of an array area. Also, a pattern containing the scumming is transferred in the lithography process for imaging a contact hole for the capacitor structure in a final profile, resulting in overlay failure and capacitance loss of a structure device. Therefore, embodiments of this disclosure provide a method of manufacturing a semiconductor structure with an anti-reflection tri-layer stack.

It should be noted that when the following figures, such as FIGS. 1 to 8, are illustrated and described as a series of operations or steps, the description order of these operations or steps should not be limited. For example, some operations or steps may be undertaken in a different order than in the present disclosure, or some operations or steps may occur currently, or some operations may not be used, and/or some operations or steps may be repeated. Moreover, the actual operations or steps of process stages may require additional operations or steps before, during or after forming the semiconductor structure (for example, a semiconductor structure 100 in FIG. 8) to completely form the semiconductor structure 100. Therefore, the present disclosure may briefly illustrate some of these additional operations or steps. Further, unless otherwise stated, the same explanations discussed for the following figures, such as FIGS. 1 to 8, apply directly to the other figures.

Please refer to FIGS. 1-4. FIGS. 1-4 are views of a method of manufacturing a semiconductor structure at stages of forming a first anti-reflection layer containing a capacitor pattern according to some embodiments of this disclosure. In FIG. 1, a substrate 110 and an active layer 112 disposed on the substrate 110 are provided. The substrate 110 is defined with an array area 102 and a peripheral area 104 surrounding the array area 102, such as shown in a top view of FIG. 5 described later. Moreover, the active layer 112 includes a plurality of active structures, such as active areas, word line structures, contact plugs and like.

In some embodiments, the substrate 110 may include silicon, such as crystalline silicon, polycrystalline silicon, or amorphous silicon. The substrate 110 may include an elemental semiconductor, such as germanium. In some embodiments, the substrate 110 may include alloy semiconductors, such as silicon germanium, silicon germanium carbide, gallium indium phosphide, or other suitable materials. In some embodiments, the substrate 110 may include compound semiconductors, such as silicon carbide (SiC), gallium arsenide (GaAs), indium phosphide (InP), indium arsenide (InAs), or other suitable materials. Moreover, in some embodiments, the substrate 110 can optionally have a semiconductor-on-insulator (SOI) structure.

Next, a first film layer 120 is formed on the active layer 112. In some embodiments, the first film layer 120 includes an oxide. Subsequently, a second film layer 130 is formed on the first film layer 120. In some embodiments, the second film layer 130 includes diamond-like carbon. Further, a first anti-reflection layer 140 (such as in FIG. 4 described later) containing the capacitor pattern 148 (such as in FIG. 4 described later) is formed on the second film layer 130. In some embodiments, the first anti-reflection layer 140 is formed by a self-aligned double patterning, described as follows.

In FIG. 1, a hard mask layer 140A is formed on the second film layer 130. In some embodiments, the hard mask layer 140A is an anti-reflective coating (ARC) layer. Further, a mandrel mask 142 containing a contact hole layout is formed on a plurality of first top surfaces TS1 of the hard mask layer 140A to form a plurality of protrusions 142P. Next, a dielectric layer 144 is conformally deposited on the mandrel mask 142, and a plurality of second top surfaces TS2 and a plurality of third top surfaces TS3 of the hard mask layer 140A. In some embodiments, each of the first top surfaces has a first width W1 at a cross-section in the widest section of each of openings (such as in FIG. 4 described later), each of the third top surfaces has a second width W2 at the cross-section in the widest section of each of the openings, and the first width W1 is equal to the second width W2. In some embodiments, the dielectric layer 144 is conformally deposited through atomic layer deposition (ALD) process. In the embodiments through ALD process, the dielectric layer 144 may be deposited on the mandrel mask 142, and a plurality of second top surfaces TS2 and a plurality of third top surfaces TS3 of the hard mask layer 140A relatively uniform.

Figure 2:
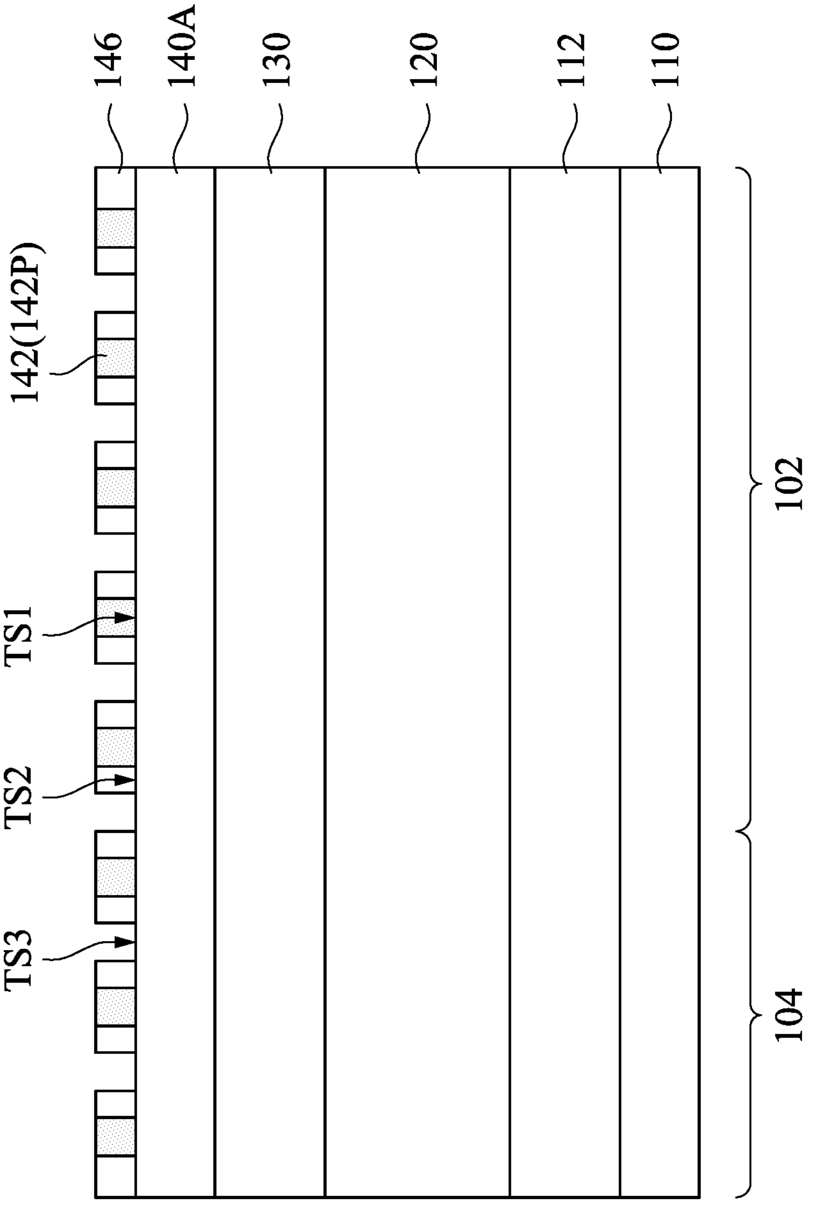

In FIG. 2, the dielectric layer 144 (such as in FIG. 1) on the mandrel mask 142 and the third top surfaces TS3 of the hard mask layer 140A is removed to form a plurality of spacers 146 on both sides of each of the protrusions 142P of the mandrel mask 142. The third top surfaces TS3 of the hard mask layer 140A are exposed. Moreover, after removing the dielectric layer 144 (such as in FIG. 1) on the mandrel mask 142, a top surface of each of the spacers 146 and a top surface of the mandrel mask 142 are coplanar.

Figure 3:
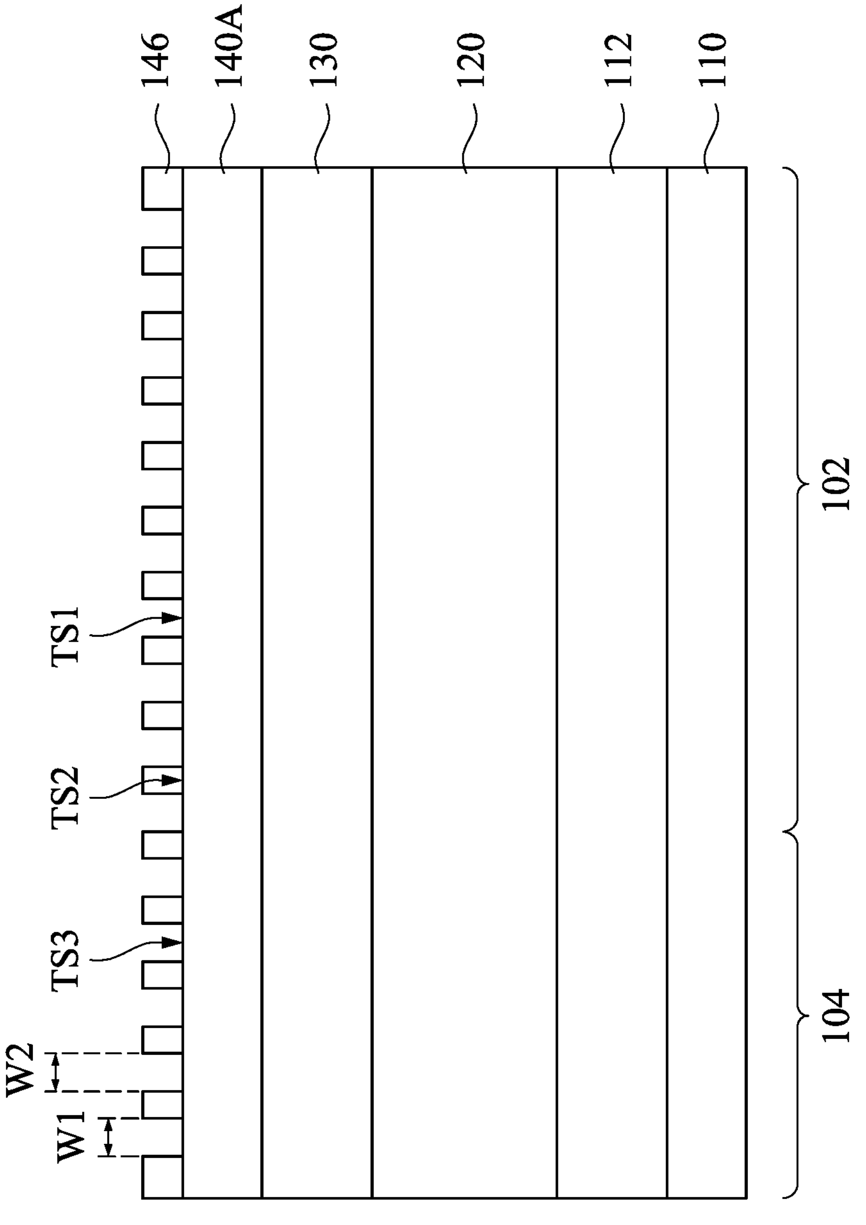

In FIG. 3, the mandrel mask 142 (such as in FIG. 2) is removed to expose the first top surfaces TS1 of the hard mask layer 140A. That is, the first top surfaces TS1 and third top surfaces TS3 of the hard mask layer 140A are exposed, and the second top surfaces TS2 of the hard mask layer 140A are covered with the spacers 146. Subsequently, a lithography process is performed on the spacers 146, the first top surfaces TS1 of the hard mask layer 140A and the third top surfaces TS3 of the hard mask layer 140A.

Figure 4:
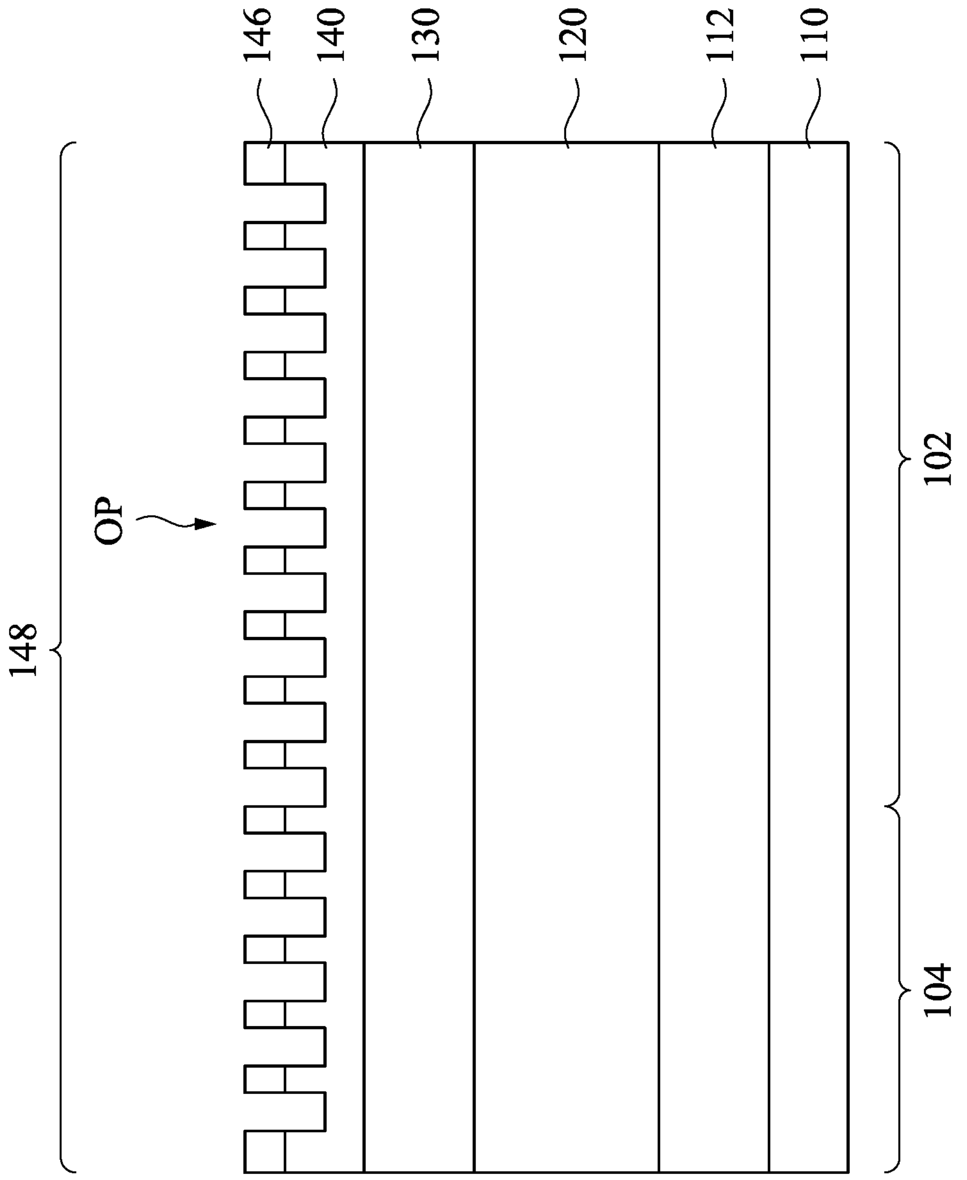

In FIG. 4, the hard mask layer 140A (such as in FIG. 3) at potions of the first top surfaces TS1 and the third top surfaces TS3 of the hard mask layer 140A is etched to form the plurality of openings OP in the hard mask layer 140A, and then the first anti-reflection layer 140 containing the capacitor pattern 148 is formed. Further, as shown in an enlarged figure from a dotted box in the top view of FIG. 5, the capacitor pattern 148 is a diagonal pattern or a non-orthogonal pattern. In some embodiments, the spacers 146 are removed after forming the first anti-reflection layer 140 containing the capacitor pattern 148. In some embodiments, the spacers 146 are removed through a planarization process, such as a chemical mechanical polishing (CMP) process. Through the self-aligned double patterning, while shrinking the semiconductor structure 100 (such as in FIG. 8), it is possible to obtain the first anti-reflection layer 140 containing the capacitor pattern 148 for making shrinking-sized capacitor structures in the embodiments of the first width W1 being equal to the second width W2. Also, an area of the hard mask layer 140A can be better utilized.

Figure 5:
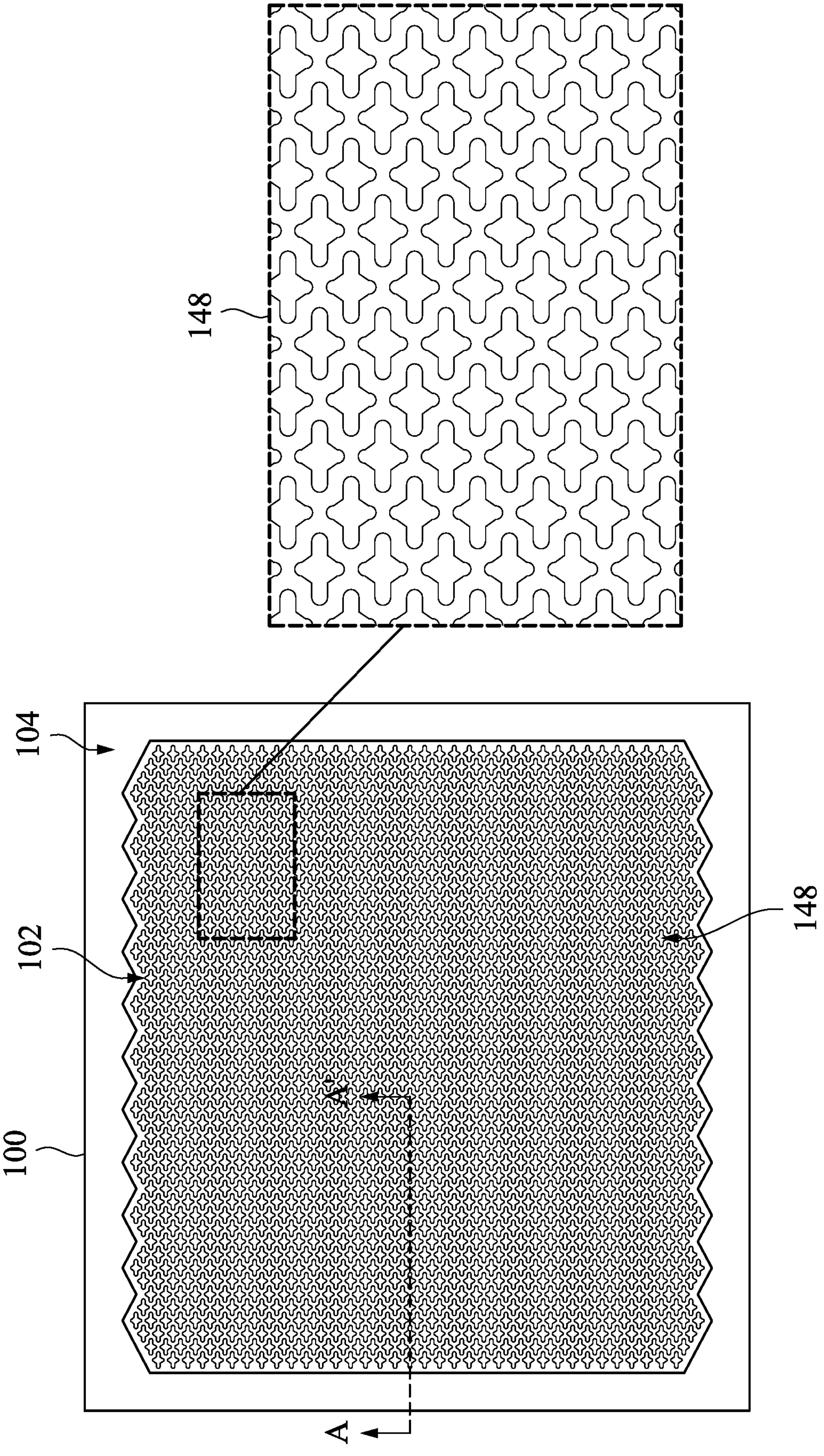
FIGS. 5-7 are views of a method of manufacturing a semiconductor structure at stages for forming a plurality of trenches for capacitor structures according to some embodiments of this disclosure.
Figure 6:
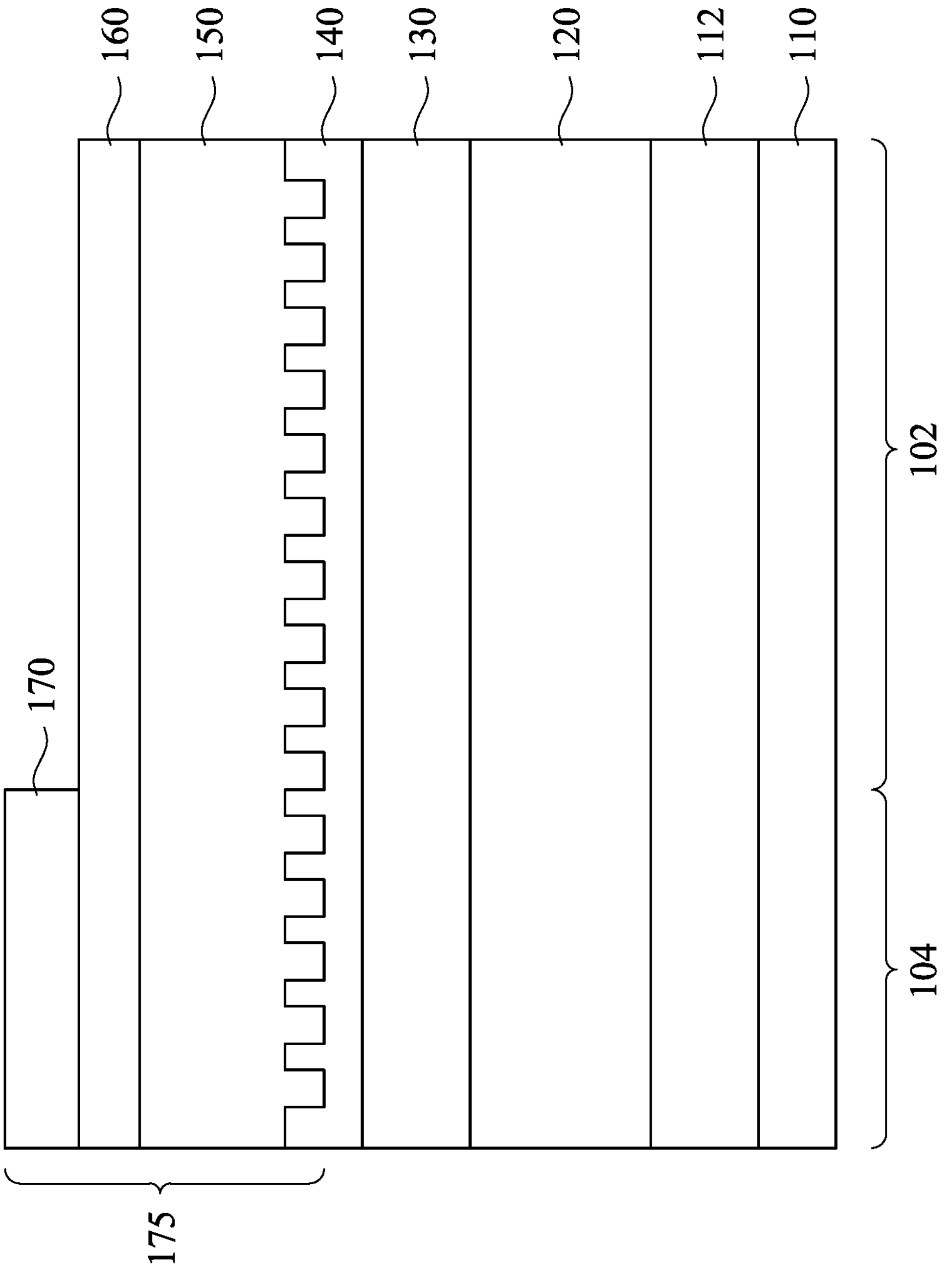
Figure 7:
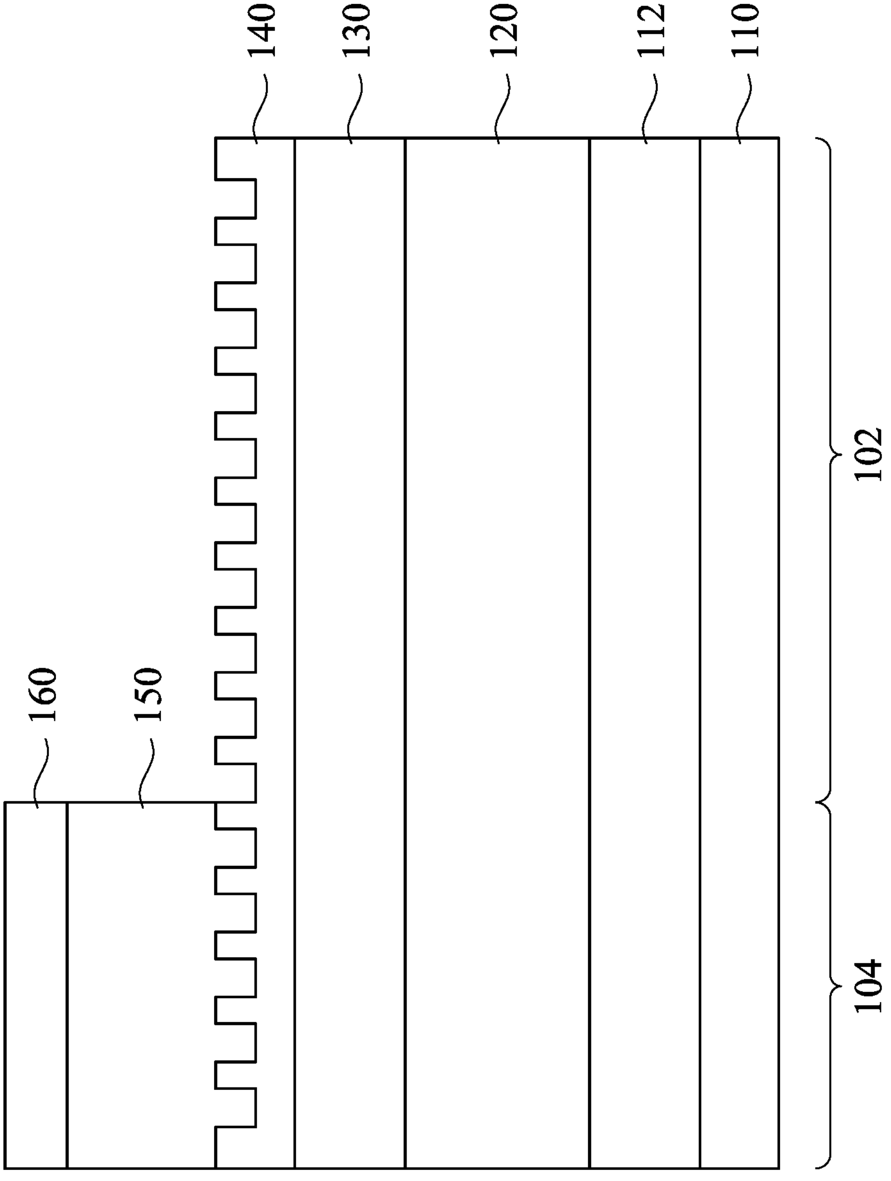
Figure 8:
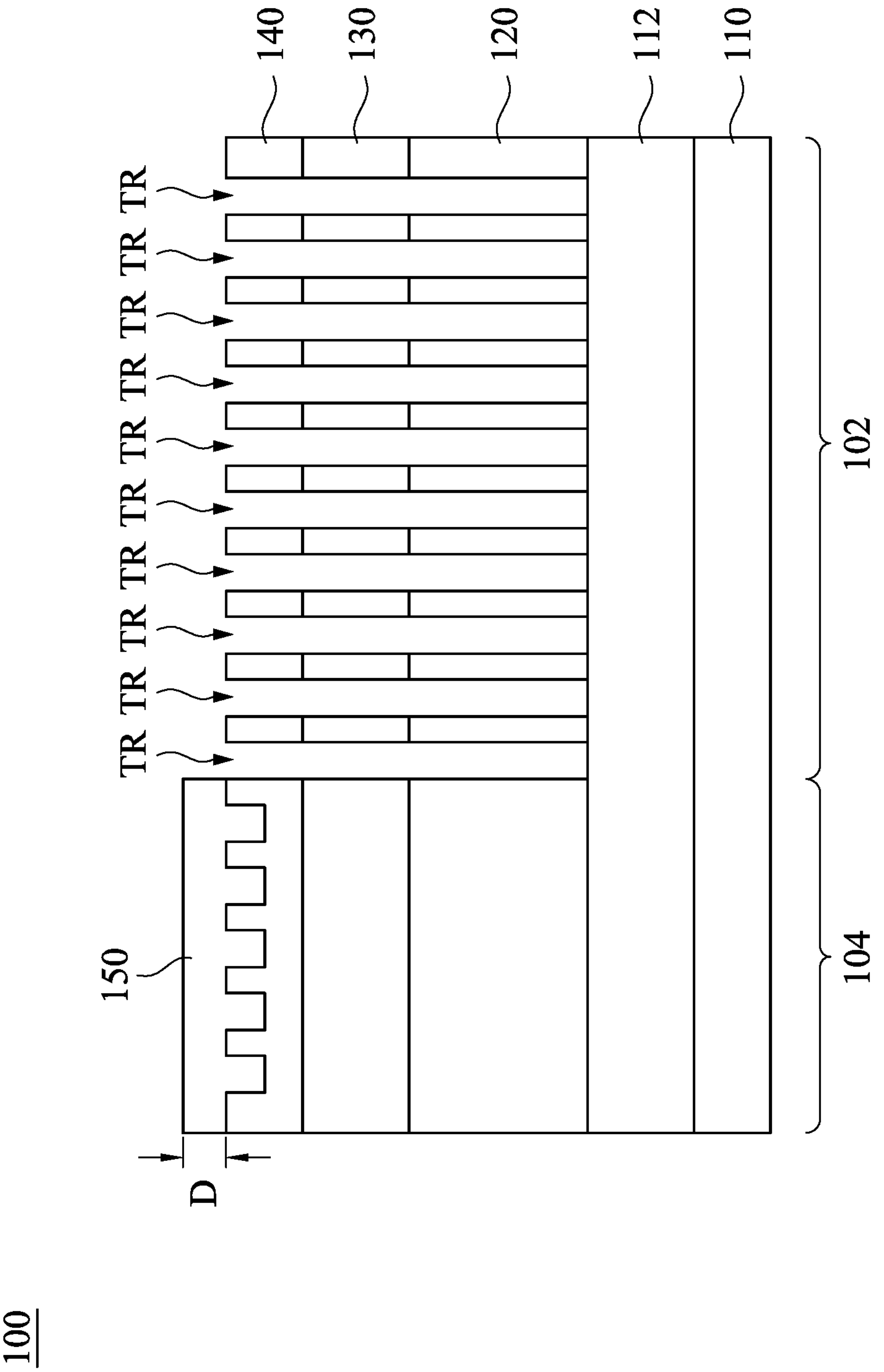
FIG. 8 is a top view of a semiconductor structure containing a capacitor pattern according to some embodiments of this disclosure.

Next, please refer to FIGS. 5-8. FIG. 5 is a top view of a semiconductor structure containing a capacitor pattern according to some embodiments of this disclosure, and FIGS. 6-8 are views of a method of manufacturing a semiconductor structure at stages for forming a plurality of trenches for capacitor structures with a cross-section AA' from FIG. 5 according to some embodiments of this disclosure.

In FIG. 6, a second anti-reflection layer 150 is formed on the first anti-reflection layer 140 containing the capacitor pattern 148 (such as in FIG. 4). Specifically, the second anti-reflection layer 150 is formed by spin-on coating process. In some embodiments, the second anti-reflection layer 150 includes Si. Subsequently, a third anti-reflection layer 160 formed on the second anti-reflection layer 150. Then, a photoresist mask 170 is formed on the third anti-reflection layer in the peripheral area 104 to expose a top surface of the third anti-reflection layer 160 in the array area 102. That is, an anti-reflection tri-layer stack 175 including the second anti-reflection layer 150, the third anti-reflection layer 160 and the photoresist mask 170 is formed. Similar to a pattern in the left portion of FIG. 5, the photoresist mask 170 formed in the peripheral area 104 is a zic-zac chop mask, and an edge of the photoresist mask 170 has a zic-zac layout. In some embodiments, forming the anti-reflection tri-layer stack 175 includes a deposition process, such as chemical vapor deposition (CVD) process, physical vapor deposition (PVD) process, ALD process or any suitable deposition process. In some embodiments, the deposition process for forming anti-reflection tri-layer stack 175 includes adding $SiH_4$ and $N_2O$. Then, a lithography process is performed on the photoresist mask 170 and the exposed top surface of the third anti-reflection layer 160 in the array area 102. In some embodiments, the lithography process includes adding $CO_2$.

Moreover, the third anti-reflection layer 160 is a nitrogen-free anti-reflection layer. When an anti-reflection layer includes nitrogen, a defect, SiON, formed on the anti-reflection layer caused by a reaction of $SiH_4$ and $N_2O$. In this way, the defect on the anti-reflection layer leads to imaging defect during the lithography process, and further subsequent structural defects are generated. In the embodiments of this disclosure, since the third anti-reflection layer 160 is nitrogen-free, the defect, SiON, the reaction of $SiH_4$ and $N_2O$ is not generated. Instead, $SiH_4$ retained in the deposition process and $CO_2$ added in the lithography process react to each other and SiCO is generated, not generating the defect on the third anti-reflection layer. Thus, an imaging defect is also not occurred in the lithography process in the embodiments of this disclosure, and the rework cycle time can be decreased. Moreover, greenhouse gas emissions, such as $CO_2$ emissions, can be reduced.

In FIG. 7, the photoresist mask 170 (such as in FIG. 6) on the third anti-reflection layer 160 in the peripheral area 104 is removed after the lithography process, and the third anti-reflection layer 160 and the second anti-reflection layer 150 in the array area 102 are etched after the lithography process until exposing a top surface of the first anti-reflection layer 140 in the array area 102. In some embodiments, the photoresist mask 170 (such as in FIG. 6) is etched by a dry etching process. In some embodiments, the dry etching process is performed through $Cl_2$, COS or $SO_2$ combined with $O_2$.

In FIG. 8, the first anti-reflection layer 140, the second film layer 130 and the first film layer 120 in the array area 102 area are etched to form a plurality of trenches TR based on the capacitor pattern 148 (such as in FIG. 4). As well, the third anti-reflection layer 160 (such as in FIG. 6) on the second anti-reflection layer 150 in the peripheral area 104 is removed by etching, and an upper portion of the second anti-reflection layer 150 in the peripheral area 104 is removed by etching. In some embodiments, the first anti-reflection layer 140, the second film layer 130 and the first film layer 120 are etched by the dry etching process, as well the third anti-reflection layer 160 (such as in FIG. 7) on the second anti-reflection layer 150 in the peripheral area 104 and the upper portion of the second anti-reflection layer 150 in the peripheral area 104 are removed by the dry etching process. In some embodiments, the dry etching process is performed through $Cl_2$, COS or $SO_2$ combined with $O_2$. In addition, since the second anti-reflection layer 150 in the peripheral area 104 is not completely removed by etching, there is a height difference D between a top surface of the retained second anti-reflection layer 150 and a topmost surface of the first anti-reflection layer 140.

As stated as above, through the anti-reflection tri-layer stack, the scumming formed at an edge of the photoresist mask in the array area can be eliminated. Also, since the anti-reflection tri-layer stack includes the nitrogen-free anti-reflection, the defect, formed by $SiH_4$ and $N_2O$, on anti-reflection tri-layer stack is not generated. The second anti-reflection layer, such as a spin-on coating layer, is flatten by spin-on coating, so the footing is formed in a tight space of the semiconductor structure. Thus, a critical dimension (CD) bias of ADI (after develop inspection) to AEI (after etch inspection) can be minimize. Moreover, a storage capacitance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor structure, comprising:

providing a substrate comprising an active layer on the substrate, wherein the substrate is defined with an array area and a peripheral area surrounding the array area;

forming a first film layer on the active layer;

forming a second film layer on the first film layer;

forming an anti-reflection tri-layer stack containing a capacitor pattern on the second film layer, and the anti-reflection tri-layer stack comprises a nitrogen-free anti-reflection layer;

forming a photoresist mask on the anti-reflection tri-layer stack to expose the anti-reflection tri-layer stack in the array area;

performing a lithography process on the photoresist mask and the anti-reflection tri-layer stack in the array area; and forming a plurality of trenches in the second film layer and the first film layer in the array area based on the capacitor pattern.

2. The method of claim 1, wherein forming the anti-reflection tri-layer stack comprises adding $SiH_4$, performing the lithography process on the photoresist mask comprises adding $CO_2$, and a retained $SiH_4$ and $CO_2$ react to each other and SiCO is generated.

3. The method of claim 1, wherein forming the anti-reflection tri-layer stack comprises:

forming a first anti-reflection layer containing the capacitor pattern on the second film layer;

depositing a second anti-reflection layer and a third anti-reflection layer on the first anti-reflection layer in sequence, wherein the third anti-reflection layer is the nitrogen-free anti-reflection layer; and forming a photoresist mask on the third anti-reflection layer in the peripheral area of the semiconductor structure.

4. The method of claim 3, wherein the first anti-reflection layer is formed by a self-aligned double patterning.

5. The method of claim 4, wherein the self-aligned double patterning comprises:

forming a hard mask layer on the second film layer;

forming a mandrel mask containing a contact hole layout on a plurality of first top surfaces of the hard mask layer to form a plurality of protrusions;

depositing conformally a dielectric layer on the mandrel mask, and a plurality of second top surfaces and a plurality of third top surfaces of the hard mask layer;

removing the dielectric layer on the mandrel mask and the plurality of third top surfaces of the hard mask layer to form a plurality of spacers on both sides of each of the plurality of the protrusions of the mandrel mask, wherein the plurality of the third top surfaces of the hard mask layer are exposed;

removing the mandrel mask to expose the plurality of the first top surfaces of the hard mask layer;

performing the lithography process on the plurality of spacers, and the plurality of first top surfaces and the plurality of third top surfaces of the hard mask layer; and etching the hard mask layer at position of the plurality of first top surfaces and the plurality of third top surfaces of the hard mask layer to form a plurality of openings in the hard mask layer.

6. The method of claim 5, wherein a top surface of each of the plurality of spacers and the mandrel mask are coplanar after removing the dielectric layer to form the plurality of spacers.

7. The method of claim 1, wherein the photoresist mask contains a zic-zac chop layout.

8. The method of claim 1, wherein the plurality of trenches are formed by a dry etching process.

9. The method of claim 8, wherein the dry etching process is performed through $Cl_2$, COS or $SO_2$ combined with $O_2$.

10. The method of claim 1, wherein the capacitor pattern is a diagonal pattern or a non-orthogonal pattern.

11. A method of manufacturing a semiconductor structure, comprising:

providing a substrate comprising an active layer on the substrate, wherein the substrate is defined with an array area and a peripheral area surrounding the array area;

forming a first film layer on the active layer;

forming a second film layer on the first film layer;

forming a first anti-reflection layer containing a capacitor pattern on the second film layer;

forming a second anti-reflection layer and a third anti-reflection layer on the first anti-reflection layer in sequence;

forming a photoresist mask on the third anti-reflection layer in the peripheral area to expose a top surface of the third anti-reflection layer in the array area;

performing a lithography process on the photoresist mask and the third anti-reflection layer in the array area; and forming a plurality of trenches in the second film layer and the first film layer in the array area based on the capacitor pattern.

12. The method of claim 11, wherein the photoresist mask is a zic-zac chop mask.

13. The method of claim 11, wherein the first anti-reflection layer containing the capacitor pattern is formed by a self-aligned double patterning.

14. The method of claim 13, wherein the self-aligned double patterning comprises:

forming a hard mask layer on the second film layer;

forming a mandrel mask containing a contact hole layout on a plurality of first top surfaces of the hard mask layer to form a plurality of protrusions;

depositing conformally a dielectric layer on the mandrel mask, and a plurality of second top surfaces and a plurality of third top surfaces of the hard mask layer;

removing the dielectric layer on the mandrel mask and the plurality of third top surfaces of the hard mask layer to form a plurality of spacers on both sides of each of the plurality of protrusions of the mandrel mask, wherein the plurality of third top surfaces of the hard mask layer are exposed;

removing the mandrel mask to expose the plurality of first top surfaces of the mandrel mask;

performing the lithography process on the plurality of spacers, and the plurality of first top surfaces and the plurality of third top surfaces of the hard mask layer; and etching the hard mask layer at position of the plurality of first top surfaces and the plurality of third top surfaces of the hard mask layer to form a plurality of openings in the hard mask layer.

15. The method of claim 11, wherein the third anti-reflection layer is nitrogen free.

16. The method of claim 15, wherein forming the first anti-reflection layer on the second film layer, the second anti-reflection layer and the third anti-reflection layer on the first anti-reflection layer in sequence comprises adding $SiH_4$, performing the lithography process on the photoresist mask comprises adding $CO_2$, and a retained $SiH_4$ and $CO_2$ react to each other and SiCO is generated.

17. The method of claim 11, wherein the plurality of trenches is formed by a dry etching process.

18. The method of claim 17, wherein the dry etching process comprises:

etching the photoresist mask on the third anti-reflection layer in the peripheral area;

etching the third anti-reflection layer and the second anti-reflection layer in the array area to expose a top surface of the first anti-reflection layer in the array area; and etching the second film layer and the first film layer in the array area based on the capacitor pattern to form the plurality of trenches.

19. The method of claim 17, wherein the dry etching process is performed through $Cl_2$, COS or $SO_2$ combined with $O_2$.

20. The method of claim 11, wherein after forming the plurality of the trenches, there is a height difference between a top surface of the first anti-reflection layer and a topmost surface of the first anti-reflection layer.

* * * * *